(12) United States Patent
Taylor (10) Patent No.: US 7,289,347 B2
(45) Date of Patent: Oct. 30, 2007

(54) SYSTEM AND METHOD FOR OPTICALLY INTERCONNECTING MEMORY DEVICES

(75) Inventor: George R. Taylor, Ham Lake, MN (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 11/062,075

(22) Filed: Feb. 18, 2005

(65) Prior Publication Data

US 2005/0146946 A1    Jul. 7, 2005

Related U.S. Application Data

(62) Division of application No. 10/211,036, filed on Aug. 2, 2002, now Pat. No. 7,200,024.

(51) Int. Cl.
*G11C 5/06* (2006.01)
(52) U.S. Cl. .................. 365/64; 365/63; 365/215; 365/234; 365/109; 359/107
(58) Field of Classification Search ............. 365/64, 365/63, 215, 234, 109; 359/107
See application file for complete search history.

(56) References Cited

U.S. PATENT DOCUMENTS

| | | | |
|---|---|---|---|
| 4,045,781 A | 8/1977 | Levy et al. ............... 364/200 |
| 4,240,143 A | 12/1980 | Besemer et al. ......... 364/200 |
| 4,245,306 A | 1/1981 | Besemer et al. ......... 364/200 |
| 4,253,144 A | 2/1981 | Bellamy et al. .......... 364/200 |
| 4,253,146 A | 2/1981 | Bellamy et al. .......... 364/200 |
| 4,443,845 A | 4/1984 | Hamilton et al. ........ 364/200 |
| 4,608,702 A | 8/1986 | Hirzel et al. ............. 375/110 |
| 4,707,823 A | 11/1987 | Holdren et al. ............. 370/1 |
| 4,724,520 A | 2/1988 | Athanas et al. .......... 364/200 |
| 4,813,772 A * | 3/1989 | Kowel et al. ............. 359/252 |
| 4,831,520 A | 5/1989 | Rubinfeld et al. ....... 364/200 |

(Continued)

FOREIGN PATENT DOCUMENTS

EP    0849685 A2    6/1998

(Continued)

OTHER PUBLICATIONS

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

(Continued)

*Primary Examiner*—Viet Q. Nguyen
(74) *Attorney, Agent, or Firm*—Dorsey & Whitney LLP (57) ABSTRACT

A memory device includes a semiconductor substrate in which memory circuitry has been fabricated. An address converter and a control signal converter are coupled to an address decoder and control logic, respectively. The address and control converters are operable to receive and convert optical address and control signals, respectively, into corresponding electrical address signals applied to the address decoder and control signals applied to the control logic. A read/write circuit on the substrate is coupled to a data converter formed in the substrate. The data converter is operable to receive and convert optical write data signals into corresponding electrical data signals to be applied to the read/write circuit and to receive and convert electrical read data signals into corresponding optical read data signals.

31 Claims, 6 Drawing Sheets

U.S. PATENT DOCUMENTS

| | | | |
|---|---|---|---|
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,307,381 A | 4/1994 | Ahuja | 375/107 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,355,391 A | 10/1994 | Horowitz et al. | 375/36 |
| 5,379,382 A | 1/1995 | Work et al. | 395/275 |
| 5,423,009 A | 6/1995 | Zhu | 710/307 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,608,264 A * | 3/1997 | Gaul | 257/734 |
| 5,623,534 A | 4/1997 | Desai et al. | 379/59 |
| 5,638,334 A | 6/1997 | Farmwald et al. | 365/230.03 |
| 5,638,534 A | 6/1997 | Mote, Jr. | 395/485 |
| 5,659,798 A | 8/1997 | Blumrich et al. | 395/846 |
| 5,687,325 A | 11/1997 | Chang | 395/284 |
| 5,706,224 A | 1/1998 | Srinivasan et al. | 365/49 |
| 5,710,733 A | 1/1998 | Chengson et al. | 365/52 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,787,475 A | 7/1998 | Pawlowski | 711/137 |
| 5,796,413 A | 8/1998 | Shipp et al. | 345/522 |
| 5,818,844 A | 10/1998 | Singh et al. | 370/463 |
| 5,818,984 A * | 10/1998 | Ahmad et al. | 385/14 |
| 5,819,304 A | 10/1998 | Nilsen et al. | 711/5 |
| 5,822,255 A | 10/1998 | Uchida | 365/194 |
| 5,831,467 A | 11/1998 | Leung et al. | 327/319 |
| 5,832,250 A | 11/1998 | Whittaker | 395/471 |
| 5,875,352 A | 2/1999 | Gentry et al. | 395/843 |
| 5,875,454 A | 2/1999 | Craft et al. | 711/113 |
| 5,887,159 A | 3/1999 | Burrows | 395/567 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,023,726 A | 2/2000 | Saksena | 709/219 |
| 6,026,226 A | 2/2000 | Heile et al. | 395/500.13 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,073,190 A | 6/2000 | Rooney | 710/56 |
| 6,076,139 A | 6/2000 | Welker et al. | 711/104 |
| 6,078,451 A | 6/2000 | Ioki | 360/51 |
| 6,079,008 A | 6/2000 | Clery, III | 712/11 |
| 6,088,774 A | 7/2000 | Gillingham | 711/167 |
| 6,092,158 A | 7/2000 | Harriman et al. | 711/151 |
| 6,098,158 A | 8/2000 | Lay et al. | 711/162 |
| 6,101,151 A | 8/2000 | Watanabe et al. | 365/233 |
| 6,105,075 A | 8/2000 | Ghaffari | 710/5 |
| 6,111,757 A | 8/2000 | Dell et al. | 361/737 |
| 6,125,431 A | 9/2000 | Kobayashi | 711/154 |
| 6,128,703 A | 10/2000 | Bourekas et al. | 711/138 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,327 A * | 11/2000 | Distinti et al. | 341/126 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,185,676 B1 | 2/2001 | Poplingher et al. | 712/239 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,208,180 B1 | 3/2001 | Fisch et al. | 327/141 |
| 6,219,725 B1 | 4/2001 | Diehl et al. | 710/26 |
| 6,223,301 B1 | 4/2001 | Santeler et al. | 714/6 |
| 6,226,729 B1 | 5/2001 | Stevens et al. | 711/171 |
| 6,229,712 B1 | 5/2001 | Munoz-Bustamante et al. | 361/783 |
| 6,229,727 B1 | 5/2001 | Doyle | 365/63 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,253 B1 | 7/2001 | Oberlaender et al. | 365/230.02 |
| 6,256,692 B1 | 7/2001 | Yoda et al. | 710/104 |
| 6,266,730 B1 | 7/2001 | Perino et al. | 710/126 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,344,664 B1 | 2/2002 | Trezza et al. | 257/82 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,370,611 B1 | 4/2002 | Callison et al. | 711/105 |
| 6,373,777 B1 | 4/2002 | Suzuki | 365/230.03 |
| 6,381,190 B1 | 4/2002 | Shinkai | 365/230.03 |
| 6,389,514 B1 | 5/2002 | Rokicki | 711/136 |
| 6,392,653 B1 | 5/2002 | Malandain et al. | 345/501 |
| 6,401,213 B1 | 6/2002 | Jeddeloh | 713/401 |
| 6,405,273 B1 | 6/2002 | Fleck et al. | 710/310 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,433,785 B1 | 8/2002 | Garcia et al. | 345/531 |
| 6,434,639 B1 | 8/2002 | Haghighi | 710/39 |
| 6,434,654 B1 | 8/2002 | Story et al. | 710/307 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,377 B1 * | 9/2002 | Farnworth et al. | 710/300 |
| 6,453,393 B1 | 9/2002 | Holman et al. | 711/154 |
| 6,457,116 B1 | 9/2002 | Mirsky et al. | 712/16 |
| 6,460,114 B1 | 10/2002 | Jeddeloh | 711/120 |
| 6,462,978 B2 | 10/2002 | Shibata et al. | 365/63 |
| 6,463,059 B1 | 10/2002 | Movshovich et al. | 370/389 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |

| | | | | | | | |
|---|---|---|---|---|---|---|---|
| 6,477,621 B1 | 11/2002 | Lee et al. | 711/120 | 6,799,268 B1 | 9/2004 | Boggs et al. | 712/228 |
| 6,479,322 B2 | 11/2002 | Kawata et al. | 438/109 | 6,804,760 B2 | 10/2004 | Wiliams | 711/170 |
| 6,490,188 B2 | 12/2002 | Nuxoll et al. | 365/63 | 6,804,764 B2 | 10/2004 | LaBerge et al. | 711/170 |
| 6,493,803 B1 | 12/2002 | Pham et al. | 711/147 | 6,807,630 B2 | 10/2004 | Lay et al. | 713/2 |
| 6,496,193 B1 | 12/2002 | Surti et al. | 345/552 | 6,811,320 B1 | 11/2004 | Abbott | 385/58 |
| 6,496,909 B1 | 12/2002 | Schimmel | 711/163 | 6,816,931 B2 | 11/2004 | Shih | 710/62 |
| 6,501,471 B1 | 12/2002 | Venkataraman et al. | 345/424 | 6,816,947 B1 | 11/2004 | Huffman | 711/151 |
| 6,502,161 B1* | 12/2002 | Perego et al. | 711/5 | 6,820,181 B2 | 11/2004 | Jeddeloh et al. | 711/169 |
| 6,505,287 B2 | 1/2003 | Uematsu | 711/170 | 6,821,029 B1 | 11/2004 | Grung et al. | 385/92 |
| 6,507,899 B1 | 1/2003 | Oberlaender et al. | 711/169 | 6,823,023 B1 | 11/2004 | Hannah | 375/296 |
| 6,523,092 B1 | 2/2003 | Fanning | 711/134 | 6,845,409 B1 | 1/2005 | Talagala et al. | 710/20 |
| 6,523,093 B1 | 2/2003 | Bogin et al. | 711/137 | 6,889,304 B2 | 5/2005 | Perego et al. | 711/170 |
| 6,526,483 B1 | 2/2003 | Cho et al. | 711/154 | 6,910,109 B2 | 6/2005 | Holman et al. | 711/156 |
| 6,526,498 B1 | 2/2003 | Mirsky et al. | 712/11 | 6,950,956 B2 | 9/2005 | Zerbe et al. | 713/400 |
| 6,539,490 B1 | 3/2003 | Forbes et al. | 713/401 | 6,956,996 B2* | 10/2005 | Gordon et al. | 385/48 |
| 6,552,304 B1 | 4/2003 | Hirose et al. | 219/216 | 6,961,259 B2* | 11/2005 | Lee et al. | 365/63 |
| 6,552,564 B1 | 4/2003 | Forbes et al. | 326/30 | 6,980,748 B2* | 12/2005 | Leas | 398/202 |
| 6,553,479 B2 | 4/2003 | Mirsky et al. | 712/16 | 6,982,892 B2* | 1/2006 | Lee et al. | 365/63 |
| 6,564,329 B1 | 5/2003 | Cheung et al. | 713/322 | 7,000,062 B2* | 2/2006 | Perego et al. | 711/5 |
| 6,567,963 B1* | 5/2003 | Trezza | 716/8 | 7,016,213 B2 | 3/2006 | Reeves et al. | 365/63 |
| 6,570,429 B1 | 5/2003 | Hellriegel | 327/295 | 7,016,606 B2 | 3/2006 | Cai et al. | 398/27 |
| 6,584,543 B2 | 6/2003 | Williams et al. | 711/105 | 7,024,547 B2 | 4/2006 | Kartoz | 713/1 |
| 6,587,912 B2 | 7/2003 | Leddige et al. | 711/5 | 7,035,212 B1 | 4/2006 | Mittal et al. | 370/230 |
| 6,590,816 B2 | 7/2003 | Perner | 365/200 | 7,047,351 B2 | 5/2006 | Jeddeloh | 711/5 |
| 6,594,713 B1 | 7/2003 | Fuoco et al. | 710/31 | 7,062,595 B2 | 6/2006 | Lindsay et al. | 710/315 |
| 6,594,722 B1 | 7/2003 | Willke, II et al. | 710/313 | 7,102,907 B2* | 9/2006 | Lee et al. | 365/63 |
| 6,598,154 B1 | 7/2003 | Vaid et al. | 712/237 | 7,106,973 B2 | 9/2006 | Kube et al. | 398/164 |
| 6,615,325 B2 | 9/2003 | Mailloux et al. | 711/154 | 7,120,723 B2 | 10/2006 | Jeddeloh | 710/311 |
| 6,622,227 B2 | 9/2003 | Zumkehr et al. | 711/167 | 7,120,727 B2* | 10/2006 | Lee et al. | 711/5 |
| 6,628,294 B1 | 9/2003 | Sadowsky et al. | 345/568 | 7,206,887 B2 | 4/2007 | Jeddeloh | 710/311 |
| 6,629,220 B1 | 9/2003 | Dyer | 711/158 | 2001/0023474 A1 | 9/2001 | Kyozuka et al. | 711/114 |
| 6,631,440 B2 | 10/2003 | Jenne et al. | 711/105 | 2001/0034839 A1 | 10/2001 | Karjoth et al. | 713/190 |
| 6,636,110 B1 | 10/2003 | Ooishi et al. | 327/565 | 2001/0039612 A1 | 11/2001 | Lee | 713/2 |
| 6,636,957 B2 | 10/2003 | Stevens et al. | 711/171 | 2002/0038412 A1 | 3/2002 | Nizar et al. | 711/170 |
| 6,643,787 B1 | 11/2003 | Zerbe et al. | 713/400 | 2002/0112119 A1 | 8/2002 | Halbert et al. | 711/115 |
| 6,646,929 B1 | 11/2003 | Moss et al. | 365/194 | 2002/0116588 A1 | 8/2002 | Beckert et al. | 711/161 |
| 6,647,470 B1 | 11/2003 | Janzen | 711/154 | 2002/0144064 A1 | 10/2002 | Fanning | 711/144 |
| 6,651,139 B1 | 11/2003 | Ozeki et al. | 711/118 | 2002/0178319 A1 | 11/2002 | Sanchez-Olea | 710/305 |
| 6,658,509 B1 | 12/2003 | Bonella et al. | 710/100 | 2003/0005223 A1 | 1/2003 | Coulson et al. | 711/118 |
| 6,661,943 B2 | 12/2003 | Li | 385/18 | 2003/0043158 A1 | 3/2003 | Wasserman et al. | 345/545 |
| 6,662,304 B2 | 12/2003 | Keeth et al. | 713/400 | 2003/0043426 A1 | 3/2003 | Baker et al. | 359/109 |
| 6,665,202 B2 | 12/2003 | Lindahl et al. | 365/49 | 2003/0093630 A1 | 5/2003 | Richard et al. | 711/154 |
| 6,667,895 B2 | 12/2003 | Jang et al. | 365/63 | 2003/0149809 A1 | 8/2003 | Jensen et al. | 710/22 |
| 6,681,292 B2 | 1/2004 | Creta et al. | 711/119 | 2003/0163649 A1 | 8/2003 | Kapur et al. | 711/146 |
| 6,697,926 B2 | 2/2004 | Johnson et al. | 711/167 | 2003/0177320 A1 | 9/2003 | Sah et al. | 711/158 |
| 6,707,726 B2 | 3/2004 | Nishio et al. | 365/189.12 | 2003/0193927 A1 | 10/2003 | Hronik | 370/351 |
| 6,715,018 B2 | 3/2004 | Farnworth et al. | 710/300 | 2003/0217223 A1 | 11/2003 | Nino, Jr. et al. | 711/105 |
| 6,718,440 B2 | 4/2004 | Maiyuran et al. | 711/137 | 2003/0227798 A1 | 12/2003 | Pax | 365/189.12 |
| 6,721,187 B2* | 4/2004 | Hall et al. | 361/760 | 2003/0229734 A1 | 12/2003 | Chang et al. | 710/36 |
| 6,721,195 B2 | 4/2004 | Brunelle et al. | 365/63 | 2003/0229762 A1 | 12/2003 | Maiyuran et al. | 711/137 |
| 6,724,685 B2 | 4/2004 | Braun et al. | 365/233 | 2003/0229770 A1 | 12/2003 | Jeddeloh | 711/213 |
| 6,728,800 B1 | 4/2004 | Lee et al. | 710/54 | 2004/0022094 A1 | 2/2004 | Radhakrishnan et al. | 365/200 |
| 6,735,679 B1 | 5/2004 | Herbst et al. | 711/167 | 2004/0044833 A1 | 3/2004 | Ryan | 711/5 |
| 6,735,682 B2 | 5/2004 | Segelken et al. | 711/220 | 2004/0064602 A1 | 4/2004 | George | 710/22 |
| 6,745,275 B2 | 6/2004 | Chang | 710/305 | 2004/0123088 A1 | 6/2004 | Poisner et al. | 713/1 |
| 6,751,113 B2 | 6/2004 | Bhakta et al. | 365/63 | 2004/0128421 A1 | 7/2004 | Forbes | 710/303 |
| 6,751,703 B2 | 6/2004 | Chilton | 711/113 | 2004/0144994 A1 | 7/2004 | Lee et al. | 257/200 |
| 6,751,722 B2 | 6/2004 | Mirsky et al. | 712/15 | 2004/0148482 A1 | 7/2004 | Grundy et al. | 711/167 |
| 6,752,539 B2 | 6/2004 | Colgan et al. | 385/92 | 2004/0230718 A1 | 11/2004 | Polzin et al. | 710/22 |
| 6,754,117 B2 | 6/2004 | Jeddeloh | 365/201 | 2004/0236885 A1 | 11/2004 | Fredriksson et al. | 710/100 |
| 6,754,812 B1 | 6/2004 | Abdallah et al. | 712/234 | 2004/0268009 A1 | 12/2004 | Shin et al. | 710/310 |
| 6,756,661 B2 | 6/2004 | Tsuneda et al. | 257/673 | 2005/0044327 A1 | 2/2005 | Howard et al. | 711/147 |
| 6,760,833 B1 | 7/2004 | Dowling | 712/34 | 2005/0071542 A1 | 3/2005 | Weber et al. | 711/105 |
| 6,771,538 B2 | 8/2004 | Shukuri et al. | 365/185.05 | 2005/0162882 A1 | 7/2005 | Reeves et al. | 365/63 |
| 6,772,261 B1 | 8/2004 | D'Antonio et al. | 710/301 | 2005/0210185 A1 | 9/2005 | Renick | 711/105 |
| 6,775,747 B2 | 8/2004 | Venkatraman | 711/137 | 2006/0179203 A1 | 8/2006 | Jeddeloh | 710/311 |
| 6,785,780 B1 | 8/2004 | Klein et al. | 711/148 | 2006/0179208 A1 | 8/2006 | Jeddeloh | 711/100 |
| 6,789,173 B1 | 9/2004 | Tanaka et al. | 711/147 | 2006/0195647 A1 | 8/2006 | Jeddeloh | 711/100 |
| 6,792,059 B2 | 9/2004 | Yuan et al. | 375/354 | 2006/0200598 A1 | 9/2006 | Janzen | 710/58 |
| 6,792,496 B2 | 9/2004 | Aboulenein et al. | 710/306 | | | | |
| 6,793,408 B2* | 9/2004 | Levy et al. | 385/88 | | | | |
| 6,795,899 B2 | 9/2004 | Dodd et al. | 711/137 | | | | |
| 6,799,246 B1 | 9/2004 | Wise et al. | 711/117 | | | | |

FOREIGN PATENT DOCUMENTS

GB    2288066    4/1995

| | | |
|---|---|---|
| JP | 2001265539 A | 9/2001 |
| WO | WO 93/19422 | 9/1993 |
| WO | WO 02/27499 A2 | 4/2002 |

OTHER PUBLICATIONS

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (×72, ECC) 168-PIN Registered FBGA SDRAM DIMM", Micron Technology, Inc., 2002, pp. 1-23.

Shanley, T. et al., "PCI System Architecture", Third Edition, Mindshare, Inc., 1995, pp. 24-25.

Gillett, R. et al., "*Using The Memory Channel Network*", Micro, IEEE, vol. 17, Issue 1, Jan.-Feb. 1997 (Abstract Only).

Gommans et al., "*Applications Drive Secure Lightpath Creation Across Heterogeneous Domains*", Communications Magazine, IEEE, vol. 44, Issue 3, Mar. 2006 (Abstract Only).

Hsieh et al., "*On The Design Of A Local Switch For Heterogenous Multi-subsystem Interconnected*", IEEE XPLORE, Oct. 1993 (Abstract Only).

Depari, A. et al., "*USB Sensor Network For Industrial Applications*", IEEE XPLORE, May 2004 (Abstract Only).

Gillingham, Peter, SLDRAM Architectural and Functional Overview, 1997 SLDRAM Consortium, Aug. 29, 1997, p. 14.

"Neural network controller for minimizing hub shear forces in helicopter" by Omkar et al. (abstract only) Publication Date: Sep. 14-17, 1998.

\* cited by examiner (PRIOR ART)
FIG.1

SYSTEM AND METHOD FOR OPTICALLY INTERCONNECTING MEMORY DEVICES

CROSS-REFERENCE TO RELATED APPLICATION

This application is a divisional of pending U.S. patent application Ser. No. 10/211,036, filed Aug. 2, 2002 now U.S. Pat. No. 7,200,024.

TECHNICAL FIELD

This invention relates generally to structures for interconnecting memory devices. More specifically, the present invention relates to methods and apparatus for communicating with memory devices while eliminating cross talk and decreasing noise.

BACKGROUND OF THE INVENTION

A main focus of the contemporary semiconductor industry is the creation of smaller and more efficient memory devices and memory modules. These efforts are often frustrated by cross talk and signal noise. Cross talk is an inductive effect which can arise when a variable current flows through a conductor. Variable current creates a corresponding variable magnetic field surrounding the conductor capable of inducing a disruptive signal in any adjacent conductors passing through the magnetic field. As a consequence, the placement of conductors must be carefully engineered in order to maintain suitable distances of separation between the conductors to minimize the effects of cross talk.

Similarly, noise is interference that results in the corruption of electrical signal integrity. Noise can be caused by any of a variety of different sources, including radio waves and adjacent electrical wires or magnetic fields. Common techniques for ameliorating noise include shielding conductors and spacing conductors from each other, and from other electrical components.

Overall, the necessity of such careful considerations in shielding and spreading out conductors to minimize the effects of cross talk and noise complicates efforts to create cheaper and smaller memory devices.

A common memory device, such as a dynamic random access memory (DRAM), includes a semiconductor on which electronic circuitry (i.e., an integrated circuit) is fabricated. The chip is physically and electrically attached to a chip package, which is a protective container, such as a plastic dual-in-line package (DIP) or printed circuit board to which the chip is coupled. The chip is typically electrically coupled to the chip package by forming electrical connections between bonding pads on the chip and leads or pins on the chip package.

As the functionality of memory devices increases, the complexity of the electronic circuitry typically increases along with the required number of pins on the chip package required to support this increased functionality. For example, as the storage capacity of a DRAM increases, more address pins are required to access the data stored in the DRAM. To couple the DRAM to a circuit board, each pin must be electrically coupled to a conductive trace in a control, address or data bus. As the number of pins on the DRAM increases, the corresponding spacing between pins and conductive traces decreases, which heightens the potential for cross talk and noise on the control, address and data busses.

In a typical application, a plurality of DRAMs are mounted on a circuit board to form a memory module. Each DRAM receives address and control signals through address and control terminals on the circuit board, and has a data bus coupled to a corresponding data terminals on the circuit board. Typically, the memory module has a data bus that is M bits wide, where M is an integer multiple of N, which is the width of the data bus of each DRAM. Each DRAM on the module provides N of the M bits in response to common address and control signals applied to all DRAMs on the module. For example, a typical memory module includes 8 DRAMs each having an 8 bit wide data bus to form a 64 bit wide data bus on the memory module. Another typical memory module includes 9 DRAMs, each having an 8 bit wide data bus to form a 72 bit wide data bus on the memory module with 8 bits that function as error checking and correction bits.

Figure 1:
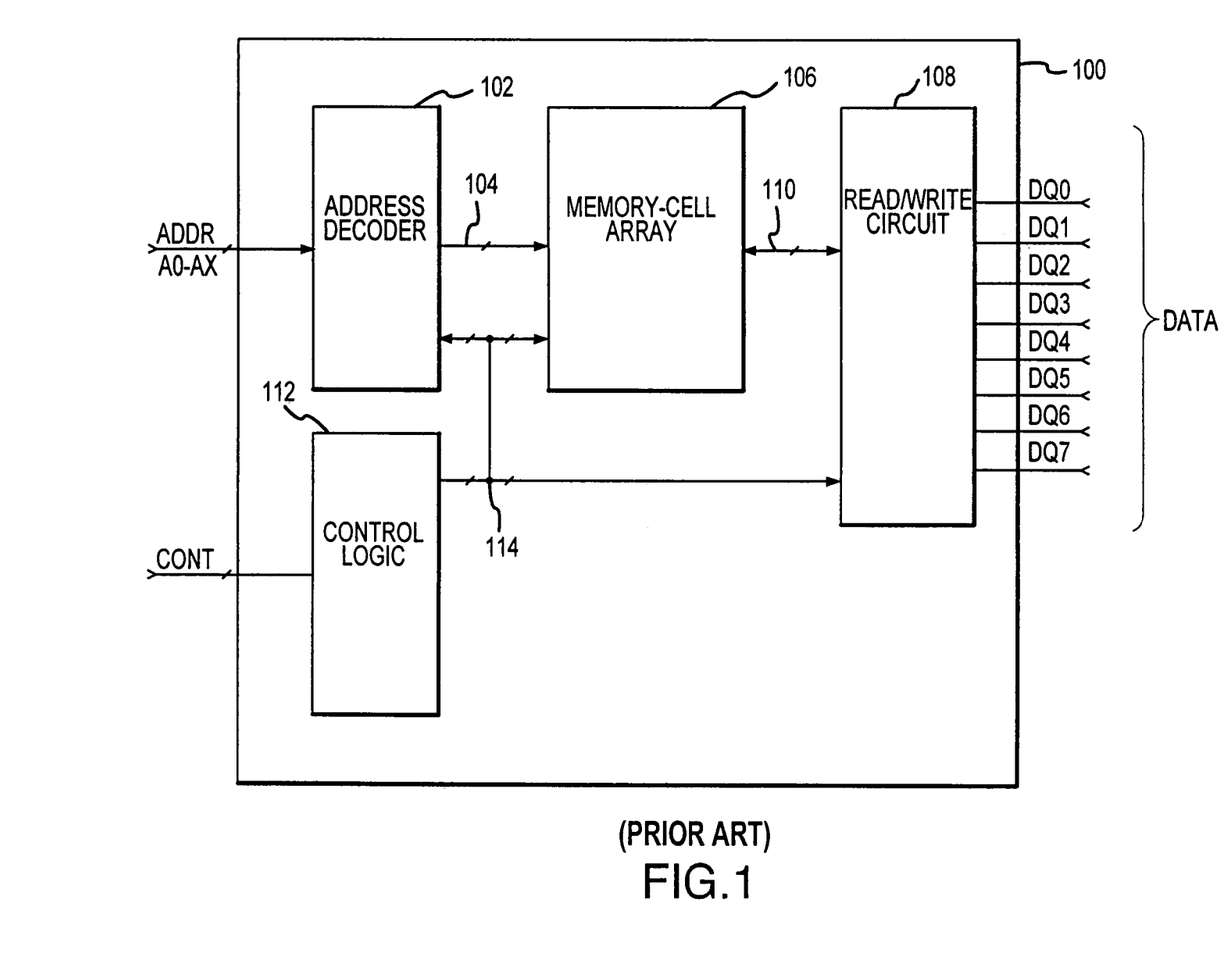
FIG. 1 is a functional block diagram of a conventional memory device.

FIG. 1 is a simplified block diagram of a DRAM 100 including an address decoder 102 that receives address bits A0-AX on an address bus ADDR and decodes these address bits and applies decoded address signals 104 to a memory-cell array 106. The memory-cell array 106 includes a plurality of memory cells (not shown) arranged in rows and columns, each memory cell storing a bit of data. The data stored in the memory cells is accessed in response to the decoded address signals 104 from the address decoder 102. A read/write circuit 108 is coupled to the memory-cell array 106 through an internal data path 110 and is coupled to an external data bus DATA of the DRAM 100. In the example of FIG. 1, the data bus DATA includes 8 external terminals over which data bits DQ0-7 are transferred to and from the DRAM 100.

As discussed above, however, the data bus DATA can include more terminals, such as 32 terminals, to transfer a corresponding number of data bits. As the number of terminals increases, the spacing between the terminals on the data bus DATA decreases, increasing the risk of cross talk and noise. The DRAM 100 also includes control logic 112 that receives a plurality of control signals applied on an external control bus CONT. In response to the control signals, the control logic 112 generates a plurality of control and timing signals 114 to control the timing and operation of the address decoder 102, memory-cell array 106, and read/write circuit 108 during operation of the DRAM 100.

In operation, an external circuit (not shown) such as a memory controller applies address, control, and data signals to the DRAM 100 over the address bus ADDR, control bus CONT, and data bus DATA, respectively, to control the operation of the DRAM. During read operations, the external circuit applies a read command to the DRAM 100 in the form of appropriate address signals on the address bus ADDR and control signals on the control bus CONT. In response to the applied address signals, the address decoder 102 accesses addressed memory cells in the memory-cell array 106 and applies the read data stored in the addressed memory cells over the internal data path 110 to the read/write circuit 108 which, in turn, places the read data on the data bus DATA as read data bits DQ0-7. The control logic 112 generates the appropriate control and timing signals 114 to control the address decoder 102, memory-cell array 106, and read/write circuit 108 during the read operation.

During write operations, the external circuit applies a write command to the DRAM 100 in the form of appropriate address signals and control signals on the ADDR and CONT buses, respectively, and also applies write data bits DQ0-7 on the data bus DATA. Once again, in response to the applied address signals, the address decoder 102 accesses the addressed memory cells in the memory-cell array 106. The read/write circuit 108 transfers the applied write data bits DQ0-7 over the internal data path 110 and into the addressed memory cells in the memory-cell array 106. The control logic 112 operates during write operations to generate the appropriate control and timing signals 114 to control the address decoder 102, memory-cell array 106, and read/write circuit 108.

In both of the read and the write operations, considerable potential for cross talk and noise exists as electrical signals are coupled to and from the DRAM through the address bus ADDR, the control bus CONT, and the data bus DATA. This is exacerbated as the number of terminals on these busses increases, and the spacing between the terminals is necessarily decreased.

There is thus a need to decrease the density of busses coupling electrical signals to and from the pins of a DRAM to lessen the potential for cross talk and noise, without reducing the number of pins on the DRAM.

SUMMARY OF THE INVENTION

According to one aspect of the present invention, a memory device includes a semiconductor substrate including memory circuitry. The memory circuitry includes an address decoder coupled to an address converter formed in the substrate., The address converter is operable to receive and convert optical address signals into corresponding electrical address signals to be applied to the address decoder. Additionally, the memory circuitry includes a read/write circuit coupled to a data converter formed in the substrate. The data converter is operable to receive and convert optical data signals into corresponding electrical data signals to be applied to the read/write circuit and to receive and convert electrical data signals into corresponding optical data signals. A control circuit is coupled to a control converter formed in the substrate. The control converter is operable to receive and convert optical control signals into corresponding electrical control signals to be applied to the control circuit. In addition, a memory-cell array is coupled to the address decoder, control circuit, and read/write circuit.

DETAILED DESCRIPTION OF THE INVENTION

Figure 2:
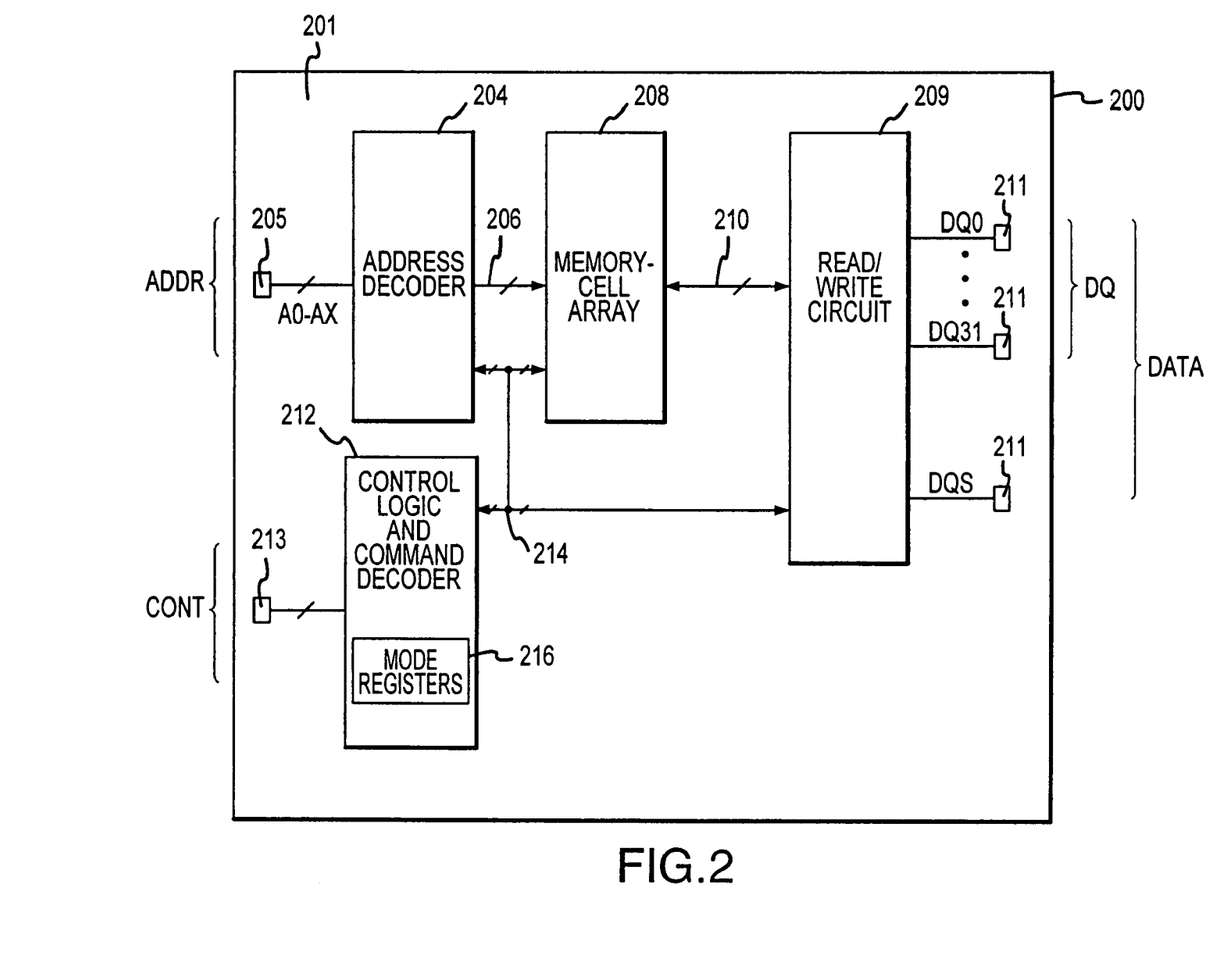
FIG. 2 is a functional block diagram of a memory device including control, address, and data converters according to one embodiment of the present invention.

FIG. 2 is a functional block diagram of a memory device 200 that receives control signals, address signals, and data signals optically, as will be explained in more detail below. In the simplified block diagram of FIG. 2, the memory device 200 is a double data rate ("DDR") DDR SDRAM, which performs an event, such as latching data, with each transition of a clock signal. However, the principles described herein are applicable to any memory device, such as conventional asynchronous DRAMs and synchronous DRAMs (SDRAMs), as well as packetized memory devices like SLDRAMs and RDRAMs, and are equally applicable to any integrated circuit receiving and transmitting signals to and from itself. In the following description, certain details are set forth to provide a sufficient understanding of the present invention, but one skilled in the art will appreciate that the invention may be practiced without these particular details. In other instances below, the operation of well known components have not been shown or described in detail to avoid unnecessarily obscuring the present invention.

The memory device 200 formed on a semiconductor substrate 201 includes an address converter 205, including a plurality of optical receivers formed in the substrate, which receives optical address bits A0-AX from an external optical address bus ADDR. Where mentioned, the term optical receiver should be understood to include any device capable of receiving an optical signal, for example optical Darlington transistors and optical field effect transistors. The optical address bits A0-AX are translated in the address converter 205 into corresponding electrical bits AO-AX, which are coupled to an address decoder 204 and decoded into corresponding electrical address bits. The address decoder 204 subsequently applies decoded address signals 206 to a memory-cell array 208. The memory-cell array 208 includes a plurality of memory cells (not shown) arranged in rows and columns, each memory cell storing a bit of data. The data stored in the memory cells is accessed in response to the decoded address signals 206 from the address decoder 204. A read/write circuit 54 is coupled to the memory-cell array 208 through an internal data path 55 and is optically coupled to an external optical data bus DATA of the memory device 200 through a data converter 211, which includes a plurality of optical receivers and transmitters formed in the substrate 201. Where mentioned, the term optical transmitter should be understood to include any device capable of transmitting an optical signal, including for example, vertical cavity surface emitting lasers such as described in U.S. Pat. No. 6,356,573 to Jonsson et al., which is incorporated herein by reference. The address converter 205 and the data converter 211 may both be formed in the same side of the semiconductor substrate as the address decoder 204, the memory cell array 208, and the read/write circuit 54.

The optical data bus DATA has a bandwith enabling it to transfer 32 respective data bits DQ0-31 along with a data strobe signal DQS to and from the data converter 211. In a write cycle, the optical receivers in the data converter 211 receive optical data bits DQ0-31 and translate them into corresponding electrical signals, which are then coupled to respective data input/output ports (not shown) on the read/write circuit 54. In a read cycle, data bits DQ0-DQ31 are applied to the data converter 211 by the read/write circuit 54 over respective input/output ports on the read/write circuit 54. At the data converter 211, the bits DQ0-DQ31 are translated into corresponding optical bits DQ0-DQ31 and transmitted to the optical bus DATA. The read/write circuit 54 outputs the DQS signal through an optical receiver in the data controller 211 during read operations to allow an external controller (not shown), such as a memory controller, to capture read data bits DQ0-31 in response to the DQS signal. During write operations, the read/write circuit 54 receives the DQS signal from the external controller in an optical receiver in the data converter 211 and latches write data bits DQ0-31 in response to the DQS signal.

The memory device 200 further includes a control logic 212 that optically receives a plurality of control and clocking bits from an optical control bus CONT typically applied by an external controller (not shown). The control and clocking bits are received in the memory device 200 through a control converter 213, which includes a plurality of optical receivers formed in the substrate 201. The control converter 213 may be formed in the same side of the semiconductor substrate as the control logic 212. The optical control and clocking bits are subsequently translated into corresponding electrical control and clocking signals in the control converter 213 and applied to the control logic and command decoder 212. The control signals include a chip select signal CS#, a write enable signal WE#, a column address strobe signal CAS#, and a row address strobe signal RAS#, while the clocking signals include a clock enable signal CKE# and complementary clock signals CLK, CLK#, with the "#" designating a signal as being active low. The external controller drives the control signals CS#, WE#, CAS#, and RAS# to particular states and supplies the corresponding address signals A0-AX on an optical address bus ADDR to apply a command to the memory device 200, such as a read, write, write partial, or load mode register command. The CKE signal enables clocking of the control logic and command decoder 212 by the clock signals CLK, CLK# and is utilized during self refresh operation of the memory device 200. The control logic and command decoder 212 also includes mode registers 216 that store information to define specific modes of operation of the memory device 200, such as the selection of a burst length, burst type, and CAS latency.

In response to the clock signals CLK, CLK#, the control logic and command decoder 212 latches and decodes the control signals portion of an applied command, and generates a sequence of clocking and control signals 214 that control the components 204-55 to execute the function of the applied command. The control logic and command decoder 212 latches control signals and the address decoder 204 latches address signals A0-AX signals at positive edges of the CLK, CLK* signals (i.e., the crossing point of CLK going high and CLK# going low). The read/write circuit 202 outputs read data bits DQ0-31 and latches write data bits DQ0-31 in response to both edges of the data strobe signal DQS, which as the same frequency as the CLK, CLK# signals. Thus, read data DQ0-31 and write data DQ0-31 are transferred from and to the memory device 200 at double the frequency of the clock signals CLK, CLK*. The memory device 200 is therefore referred to as a double-data-rate device because the data bits DQ0-31 being transferred to and from the memory are transferred at double the rate at which commands are latched and at double the rate of a conventional SDRAM, which transfers data at a rate corresponding to the frequency of the applied clock signal.

In operation, the external controller applies optical address, control, and data bits to the memory device 200 over the address bus ADDR, control bus CONT, and data bus DATA, respectively, to control the operation of the memory. The address bus ADDR, control bus CONT, and the data bus DATA comprise any medium capable of carrying optical signals, for example free space or optical fibers. One of the major benefits of using optical signals as opposed to electrical signals to transmit the control, address and data bits is the avoidance of electrical conductors and the potential for cross talk which accompanies them. In addition, optical conductors are also beneficial in reducing noise. This is especially the case with optical fibers, which are much less susceptible to noise than conductive traces.

In a preferred embodiment, the control bus CONT, address bus ADDR, and data bus DATA include optical fibers embedded in a circuit board connector, such as that described in U.S. Pat. No. 6,233,376 to Upgrove, incorporated herein by reference. Such a circuit board connector includes layers of optical fibers separated from each other by insulative layers. Additionally, electrical conductors may be formed in the connector and separated from each other, and from optical fibers, by insulating layers. In use, the electrical controller may be located on the connector and optically coupled to optical fibers formed therein. The memory device 200 can also be located on the connector, and its control converter 213, address converter 205 and data converter 211 may be optically coupled to optical fibers in the connector corresponding to the control bus CONT, address bus ADDR and data bus DATA, respectively. In this way, the controller can be on the same substrate as, and be optically coupled to, a plurality of memory devices 200. Alternately, the memory device 200 may be part of a memory module located on the connector, as will be discussed in more detail below.

The memory device 200 operates in the same way as previously described for the conventional DRAM 100 of FIG. 1 during read and standard write operations. Briefly, during read operations, the external controller applies a read command to the memory device 200 in the form of appropriate optical address bits on the address bus ADDR and optical control bits on the control bus CONT. The control bits are received and converted into corresponding electrical signals by the address converter 205. The electrical address signals are then latched and decoded by the address decoder 204 and applied to the memory-cell array 208. Read data from the appropriate memory cells in the memory-cell array 208 is subsequently transferred through the internal data path 55 and read/write circuit 54 to the data converter 211 where it is translated into corresponding optical read data bits and transmitted to the external data bus DATA as optical read data bits DQ0-31.

During standard write operations, the external circuit applies a write command to the memory device 200 in the form of appropriate optical address bits and control bits on the ADDR and CONT buses, respectively, and also applies write optical data bits DQ0-31 and DQS signals on the data bus DATA. Once again, in response to the applied optical address signals, the address converter 205 receives and converts the optical address bits into corresponding electrical address signals. Using the electrical address signals, the address decoder 204 accesses the addressed memory cells in the memory-cell array 208. The read/write circuit 54 latches the applied write data bits DQ0-31 in response to the DQS signal, and transfers the latched write data words over the internal data path 55 to the addressed memory cells in the memory-cell array 208.

During both read and write operations, the control logic and command decoder 212 generates appropriate clocking and control signals 214 to control the address decoder 204, memory-cell array 208, and read/write circuit 54.

Figure 3:
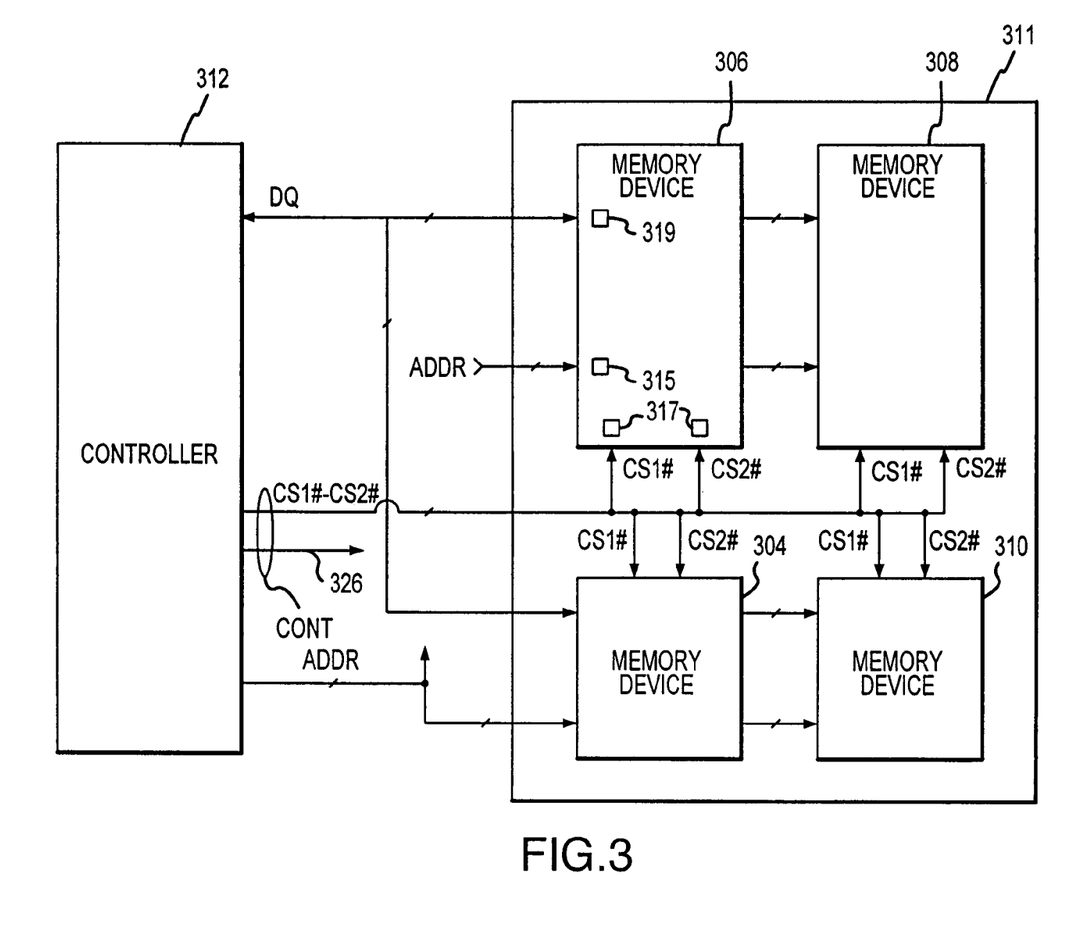
FIG. 3 is a block diagram of a memory module having a plurality of memory devices according to one embodiment of the invention.

FIG. 3 shows an alternate embodiment of the invention in which a plurality of memory devices 304-310, such as the memory device 200, are grouped together on a memory module 311. As illustrated, a controller 312 is coupled to the module 311 over an optical data bus DQ, an optical address bus ADDR, and an optical control bus CONT. As with the memory device 200 discussed above, the data bus DATA, control bus CONT, and the address bus ADDR may comprise fiber optic links, free space, optical paths formed in a substrate, or any suitable medium for communicating optical signals. The module 311 includes four memory devices 304-310, however a greater or lesser number of devices 304-310 may be coupled to the module 311. Each device 304-310 has an address converter 315, control converter 317 and data converter 319 operable to receive optical bits from the address bus ADDR, control bus CONT, and data bus DATA and convert the bits into corresponding electrical control, address and data signals. Each memory device 304-310 is then operable to apply the electrical control, address and data signals to an internal address decoder, control logic and command decoder, and read write circuit (not shown for the sake of clarity) as discussed above in FIG. 2 in order access corresponding memory cells in a memory cell array (also not shown for the sake of clarity) on each memory device 304-310. Additionally, the data converter 319 is operable to receive electrical read data bits and transmit corresponding optical read data signals to the data bus DATA.

In the example of FIG. 3, each memory device 304-310 receives two corresponding optical chip select bits CS1#-CS2# from the memory controller 312 over the CONT bus. During read and write operations the controller 312 applies a command to the memory devices 304-310 in the form of optical address bits on the address bus ADDR and optical control bits 326 along with the chip select bits CS1#-CS2# on the control bus CONT. These bits are received and decoded by control converters and address converters included in each device 304-310. The controller 312 activates one chip select bit CS1#-CS2# at a time and only the device 304-310 to which the unique chip select signal corresponds is activated. Once activated, the selected device 304-310 receives an ensuing sequence of optical control, address and data signals from the controller 312 instructing the device 304-310 to carry out a read or write sequence in the same manner as discussed above. Once the particular cycle is completed, the controller uses the chip select signals CS1#-CS2# to select and enable another device 304-310 on the module 311 for a read or a write cycle.

Figure 4:
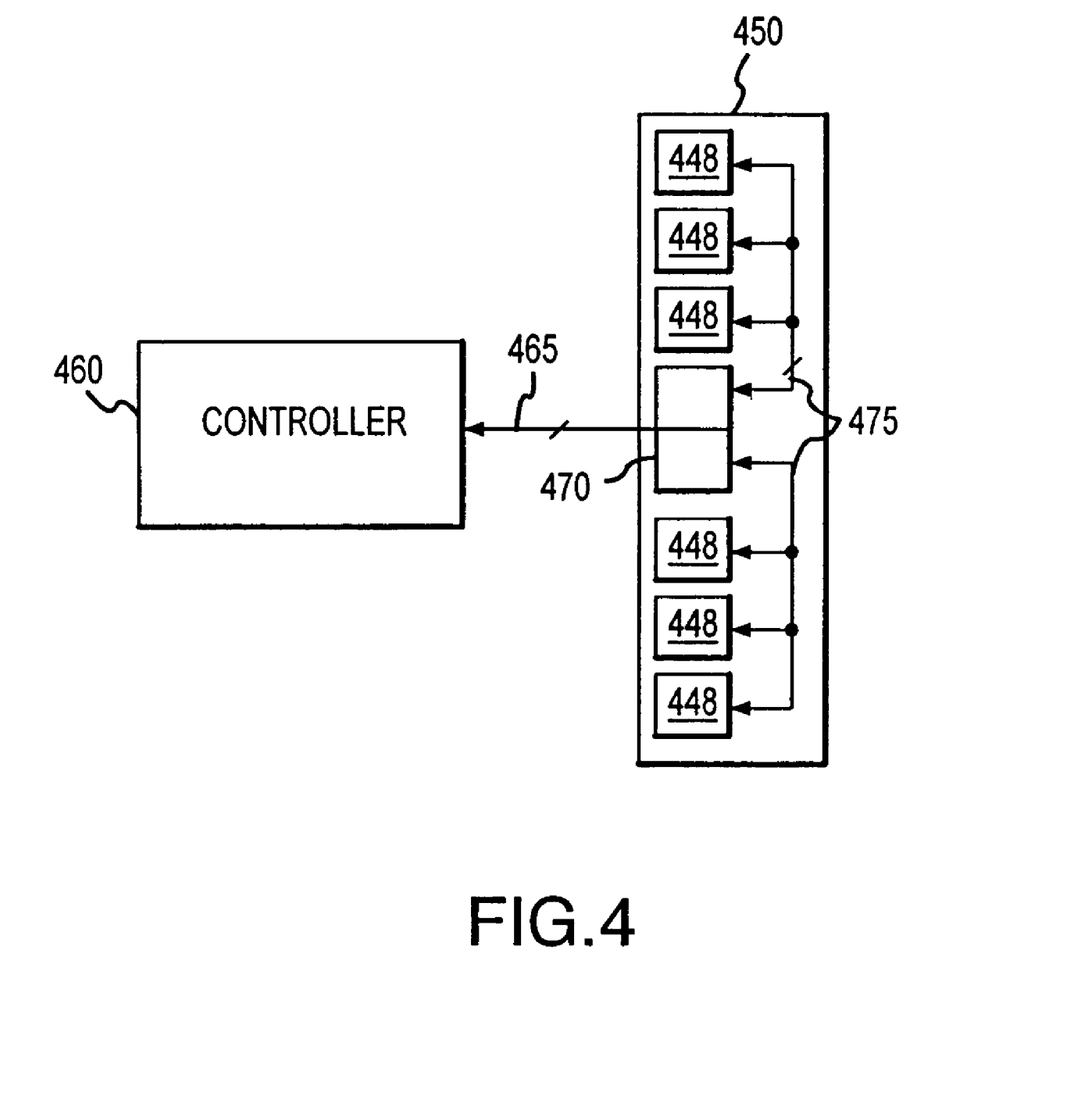
FIG. 4 is a block diagram of a memory module having a memory hub and a plurality of memory devices according to one embodiment of the invention.
Figure 5A:
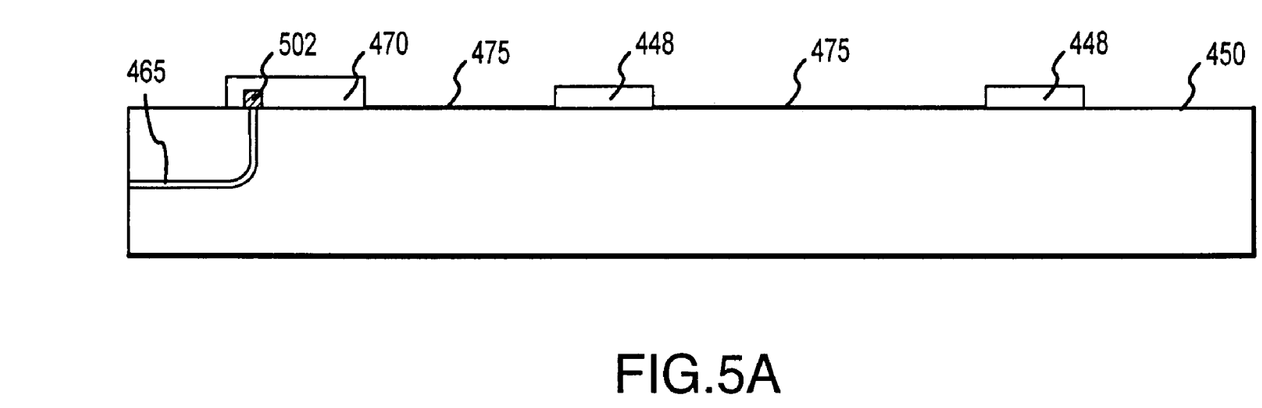
FIGS. 5A-B are cross-sectional views of a memory module having a memory hub and a plurality of memory devices according to one embodiment of the invention.
Figure 5B:
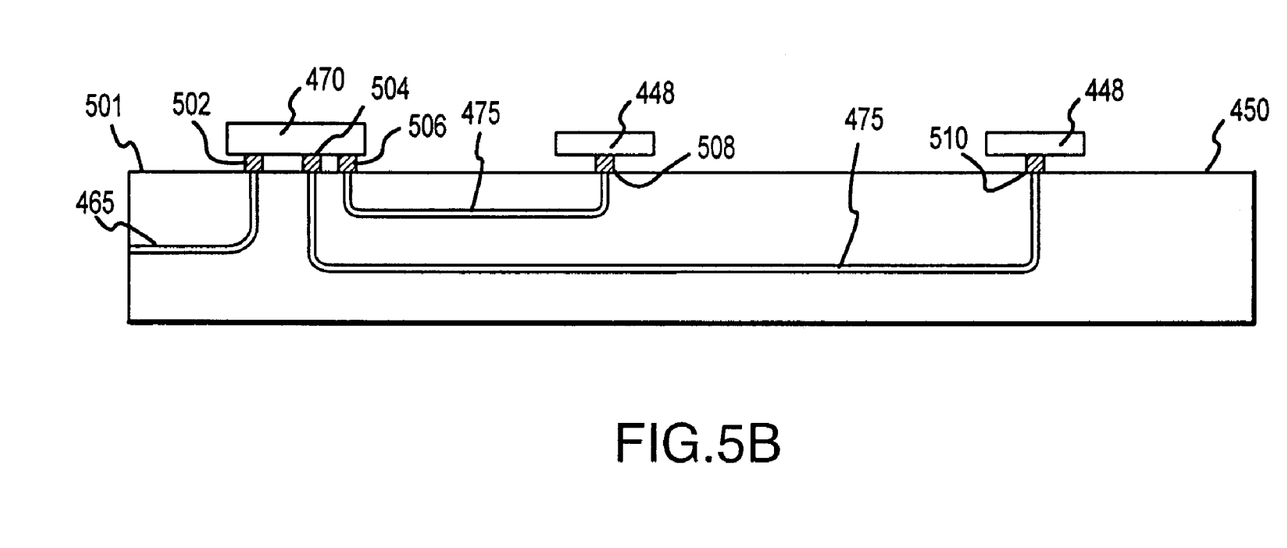

FIGS. 4, 5A and 5B show alternate embodiments of the invention in which a plurality of memory devices 448 are grouped together on a memory module 450. Turning first to FIG. 4, a system controller 460 is coupled to a memory module 450 through an optical link 465. It should be understood that more than one module 450 can be coupled to the optical link 465. The optical link 465 may comprise one or more optical fibers, free space, or optical paths formed in an insulative substrate, as discussed above. The controller 460 and the memory module 450 include an optical input/output port or separate input and output ports coupled to the optical link 465.

The memory module 450 includes a memory hub 470 for controlling access to 6 memory devices 448, which, in the example illustrated in FIG. 4, are structurally and functionally the same as device 200 discussed in FIG. 2. However, a fewer or greater number of memory devices 448 may be used. The memory hub 470 is coupled to each of the memory devices 448 through a bus system 475, which normally includes a control bus, an address bus and a data bus, and can comprise traces on the hub 470 operable to electrically couple the hub to the memory devices 448 or an optical link, or plurality of links, coupling the devices 448 to the hub 470.

The memory hub 470 can be implemented in several different embodiments. For example, as shown in the cross-sectional view of the memory module 450 in FIG. 5A, in a first embodiment the memory hub 470 can include optical receivers and transmitters in the input/output port 502 operable to receive optical control, address and data bits from the optical link 465 and convert the optical bits into corresponding electrical control, address and data signals. The input/output port 502 can also be operable to receive electrical signals, convert them into corresponding optical bits, and transmit the optical bits to the controller 460 (not shown in FIG. 5) over the optical link 465.

In this mode, the memory hub 470 is operable to communicate with the devices 448 through electrical signals coupled to the bus system 475. The devices 448 used in conjunction with such a hub 470 would have control, address and data converters dissimilar from those discussed in FIG. 1, however, since the signals being received by the devices would not have to be translated from optical bits to electrical signals. Thus optical receivers and transmitters would be omitted from the converters, and the control, address and data converters would comprise signal lines coupled to the corresponding lines of the bus system 475.

To communicate with the devices 448, the hub applies control, address and data signals to the bus system 475, with the appropriate memory device 448, or devices 448, being enabled by chip select signals contained within the control signal. In a write operation however, the control signal includes an additional write enable signal enabling the selected memory device 448 to accept data contained in the data signal and write it to an appropriate memory cell indicated by address information contained in the address signal.

Alternately, in another embodiment of the invention, the memory hub 470 could include a multiplexing function. After receiving a signal from the controller 460 over the optic link 465 and converting it into electrical control, address and data signals as discussed above, the memory hub 470 subsequently examines the electrical control signal for information indicating which memory device 448 is to be accessed. Upon finding and decoding this information, the memory hub 470 applies the electrical control, address and data signals to an individual bus, or busses, in the bus system 475 coupling the appropriate memory device 448 to the memory hub 470.

As with the aspect discussed above, if the control signal contains a write enable signal, the memory device 448 is enabled to accept data contained in the data signal and write it to the appropriate memory cells indicated by address information contained in the address signal. Otherwise, a read operation is initiated and appropriate memory cells in the memory device 448 are applied in a data signal over the individual bus in the bus system 475 coupling the memory device 448 to the memory hub 470. Once received in the memory hub 470, the data signal is subsequently converted into a signal suitable to be applied to the optical link 465, and the bits are transmitted to the controller 460 in the manner discussed above. It should be understood that in both aspects described above, the memory hub 470 may access a single bit from each memory device 448 or multiple bits as desired.

In another embodiment of the invention, the memory hub 470 communicates optically with the devices 448 as shown in the cross-sectional view of the memory module 450 in FIG. 5B. For the sake of clarity, the hub 470 and devices 448 are shown in FIG. 5B as being elevated from a top surface 501 of the memory module 450. It will be understood by those skilled in the art, however, that the hub 470 and the devices 448 could also rest flat on the surface 501 or be placed in indentations on the surface 501. Communications between the controller 460 (not shown in FIG. 5B) and the hub 470 are accomplished in the same way as described above. However, once being received from the input/output port 502, the electrical control, address and data signals are developed in the hub 470 and converted into corresponding optical control, address and data bits at input/output terminals 504, 506 coupling the memory bus 475 to the memory hub 470.

As with the first embodiment described above, in order for the hub 470 to communicate optically with the devices 448, optical control, address and data bits are applied by the hub 470 over the bus system 475 to input/output ports 508/510 including optical receivers and transmitters on the memory devices 448. The appropriate memory device 448, or devices 448, are then enabled by chip select bits contained within the control bits. In a write operation however, the control bits include additional write enable bits enabling the selected memory device 448 to accept data contained in the data bits and write it to an appropriate memory cell indicated by address information contained in the address bits.

Alternately, the memory hub 470 could include a multiplexing function in which the memory hub 470 could examine the control signal received from the controller over the optical link 465 for information indicating which memory device 448 is to be accessed. Using this information, the memory hub 470 could apply the optical control, address and data bits to an individual bus in the bus system 475 coupling the appropriate memory device 448 to the memory hub 470.

As with the aspect discussed above, if the control signal contains write enable bits, the memory device 448 is enabled to accept data contained in the data bits and write it to the appropriate memory cells indicated by address information contained in the address bits. Otherwise, a read operation is initiated and data bits from appropriate memory cells in the memory device 448 are applied as data signals over the individual bus in the bus system 475 coupling the memory device 448 to the memory hub 470. Once received in the memory hub 470, the data signals are subsequently converted into a signal suitable to be applied to the optical link 465, and the signal is transmitted to the controller 460, as discussed above. It should be understood that in both aspects described above, the memory hub 470 may access a single bit from each memory device 448 or multiple bits as desired.

Figure 6:
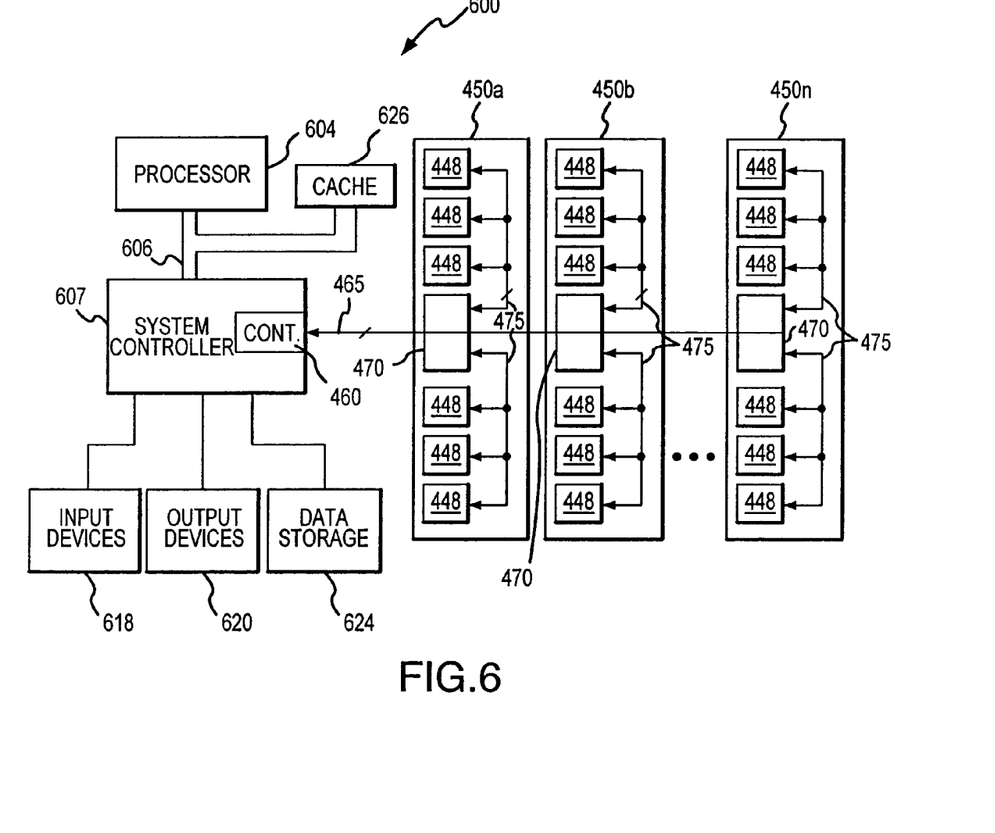
FIG. 6 is a block diagram of a computer system containing several memory modules such as illustrated in FIG. 4 according to one embodiment of the invention.

A computer system 600 using the controller 460 and the memory module 450 of FIG. 4 according to one example of the invention is shown in FIG. 6. The computer system 600 includes a processor 604 for performing various computing functions, such as executing specific software to perform specific calculations or tasks. The processor 604 includes a processor bus 606 that normally includes an address bus, a control bus, and a data bus. The computer system 600 includes a system controller 607 that is coupled to the processor bus 606. The system controller 607 also includes the controller 460, which is, in turn, optically coupled to memory modules 450a-n through the optical link 465. However, it will be understood that the controller 460 may be external to the system controller 607 and coupled to it or some other component in the computer system 600, such as the processor 604. In addition, the computer system 600 includes one or more input devices 618, such as a keyboard, mouse or game controller, coupled to the processor 604 through the system controller 607 to allow an operator to interface with the computer system 600. Typically, the computer system 600 also includes one or more output devices 620 coupled to the processor 604 through the system controller 607, such output devices typically being a printer or a video terminal. One or more data storage devices 624 are also typically coupled to the processor 604 through the system controller 607 to allow the processor 604 to store data or retrieve data from internal or external storage media (not shown). Examples of typical storage devices 624 include hard and floppy disks, tape cassettes, and compact disk read-only memories (CD-ROMs). The processor 604 is also typically coupled to cache memory 626, which is usually static random access memory ("SRAM").

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory module, comprising:
   an insulative substrate;
   a plurality of memory devices mounted on the substrate, each memory device comprising:
      a semiconductor substrate;
      a plurality of electrical input and output signal lines fabricated in the semiconductor substrate including electrical data signal lines operable to output electrical read data signals and input electrical write data signals, and electrical address and control signal lines operable to input electrical address and control signals;
      a plurality of optical receivers fabricated in the semiconductor substrate coupled to corresponding data, control and address signal lines, the receivers being operable to receive optical signals and develop corresponding electrical signals; and
      a plurality of vertical cavity surface emitting lasers fabricated in the semiconductor substrate coupled to corresponding data signal lines, the vertical cavity surface emitting lasers being operable to receive electrical read data signals and develop corresponding optical read data signals;
   a memory hub mounted on the insulative substrate, the memory hub having an input/output port and a plurality of input and output terminals including terminals outputting optical write data signals, terminals inputting optical read data signals, and terminals outputting optical command and address signals, the memory hub being operable to receive input signals coupled to the input/output port and to apply corresponding optical signals to the terminals of the memory hub, the memory hub being further operable to receive optical signals at the terminals of the memory hub and to apply output signals to the input/output port; and
   a plurality of optical paths coupling the terminals of the memory hub to the vertical cavity surface emitting lasers and the optical receivers of the memory devices.

2. The memory module of claim 1 wherein the input/output port is operable to receive optical input signals, and transmit optical output signals.

3. The memory module of claim 2 wherein the optical input signals, comprise control, address and write data signals, and the optical output signals comprise read data signals.

4. The memory module of claim 1 wherein the input/output port is operable to receive electrical input signals, and transmit electrical output signals.

5. The memory module of claim 4 wherein the electrical input signals, comprise control, address and write data signals, and the electrical output signals comprise read data signals.

6. The memory module of claim 1 wherein the memory devices comprise dynamic random access memory devices.

7. The memory module of claim 1 wherein the optical receivers comprise optical Darlington transistors.

8. The memory module of claim 1 wherein the optical receivers comprise optical field effect transistors operable to receive optical signals.

9. The memory module of claim 1 wherein each optical path comprises a plurality of optical links.

10. The memory module of claim 1 wherein each optical path comprises a fiber optic link.

11. The memory module of claim 1 wherein each optical path comprises free space.

12. The memory module of claim 1 wherein each optical path comprises control, address and data busses.

13. The memory module of claim 1 wherein the optical paths are fabricated in the insulative substrate.

14. The memory module of claim 1 wherein the memory hub applies optical hub control, address and data signals to each memory device on the module simultaneously.

15. The memory module of claim 1 wherein the memory hub detects device address information in the input signal and applies optical control, address and data signals to a corresponding memory device on the module.

16. The memory module of claim 1 wherein the insulative substrate comprises a plurality of optical paths embedded within the insulative substrate.

17. A computer system, comprising:
a data input device;
a data output device;
a processor coupled to the data input and data output devices;
a insulative substrate;
a controller coupled to the substrate and electrically coupled to the processor, the controller being operable to receive optical data signals and apply optical control, address and data signals to an optical path at a controller port;
a plurality of memory devices mounted on the substrate, each memory device comprising:
  a semiconductor substrate;
  a plurality of electrical input and output signal lines fabricated in the semiconductor substrate including electrical data signal lines operable to output electrical read data signals and input electrical write data signals; and electrical address and control signal lines operable to input electrical address and control signals;
  a plurality of optical receivers fabricated in the semiconductor substrate coupled to corresponding data, control and address signal lines, the receivers being operable to receive optical signals and generate corresponding electrical signals; and
  a plurality of vertical cavity surface emitting lasers fabricated in the semiconductor substrate coupled to corresponding data signal lines, the vertical cavity surface emitting lasers being operable to receive electrical read data signals and generate corresponding optical read data signals;
a memory hub mounted on the insulative substrate, the memory hub having an input/output port and a plurality of input and output terminals including terminals outputting optical write data signals, command signals and address signals, and terminals inputting optical read data signals, the memory hub being operable to receive input signals coupled to the input/output port and to apply corresponding optical signals to the terminals of the memory hub, the memory hub being further operable to receive optical signals at the terminals of the memory hub and to apply output signals to the input/output port; and
a plurality of optical paths coupling the terminals of the memory hub to the vertical cavity surface emitting lasers and the optical receivers of the memory devices.

18. The computer system of claim 17 wherein the optical paths are embedded within the insulative substrate.

19. The computer system of claim 17 wherein the input/output port is operable to receive optical input signals, and transmit optical output signals.

20. The computer system of claim 19 wherein the optical input signals, comprise control, address and write data signals, and the optical output signals comprise read data signals.

21. The computer system of claim 17 wherein the input/output port is operable to receive electrical input signals, and transmit electrical output signals.

22. The computer system of claim 21 wherein the electrical input signals, comprise control, address and write data signals, and the electrical output signals comprise read data signals.

23. The computer system of claim 17 wherein the memory devices comprise dynamic random access memory devices.

24. The computer system of claim 17 wherein the optical receivers comprise optical Darlington transistors.

25. The computer system of claim 17 wherein the optical receivers comprise optical field effect transistors operable to receive optical signals.

26. The computer system of claim 17 wherein each optical path comprises a plurality of optical links.

27. The computer system of claim 17 wherein each optical path comprises a fiber optic link.

28. The computer system of claim 17 wherein each optical path comprises free space.

29. The computer system of claim 17 wherein each optical path comprises control, address and data busses.

30. The computer system of claim 17 wherein the memory hub is operable to apply optical hub control, address and data signals to each memory device on the module simultaneously.

31. The computer system of claim 17 wherein the memory hub is operable to detect device address information in the input signal and apply optical control, address and data signals to a corresponding memory device on the module.

* * * * *